United States Patent
Mihnea et al.

(10) Patent No.: US 7,277,328 B2
(45) Date of Patent: *Oct. 2, 2007

(54) METHODS FOR NEUTRALIZING HOLES IN TUNNEL OXIDES IN TUNNEL OXIDES OF FLOATING-GATE MEMORY CELLS AND DEVICES

(75) Inventors: Andrei Mihnea, Boise, ID (US); Chun Chen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 112 days.

This patent is subject to a terminal disclaimer.

(21) Appl. No.: 11/217,828

(22) Filed: Sep. 1, 2005

(65) Prior Publication Data

US 2006/0007748 A1    Jan. 12, 2006

Related U.S. Application Data

(62) Division of application No. 10/875,452, filed on Jun. 24, 2004, now Pat. No. 7,215,572, which is a division of application No. 10/159,885, filed on May 29, 2002, now Pat. No. 6,795,348.

(51) Int. Cl.
G11C 11/34    (2006.01)
G11C 16/04    (2006.01)

(52) U.S. Cl. .............. 365/185.29; 365/218; 365/185.3; 365/185.18; 365/185.25

(58) Field of Classification Search ........... 365/185.29, 365/185.18, 185.25, 185.3, 218

See application file for complete search history.

(56) References Cited

U.S. PATENT DOCUMENTS

| | | |
|---|---|---|
| 4,384,349 A | 5/1983 | McElroy |
| 4,503,524 A | 3/1985 | McElroy |
| 5,357,463 A | 10/1994 | Kinney |
| 5,485,423 A | 1/1996 | Tang et al. |
| 5,650,964 A | 7/1997 | Chen et al. |
| 5,726,933 A | 3/1998 | Lee et al. |
| 5,808,937 A | 9/1998 | Chi et al. |
| 5,828,605 A | 10/1998 | Peng et al. |
| 5,862,078 A | 1/1999 | Yeh et al. |
| 5,917,755 A | 6/1999 | Rinerson et al. |

(Continued)

OTHER PUBLICATIONS

Lee et al., "Using Erase Self-Detrapped Effect To Eliminate the Flash Cell Program/Erase Cycling $V_{th}$ Window Close," IEEE, 1999.

*Primary Examiner*—Viet Q. Nguyen
(74) *Attorney, Agent, or Firm*—Leffert Jay & Polglaze, P.A.

(57) ABSTRACT

Methods for neutralizing holes in tunnel oxides of floating-gate memory cells and devices using a decrease in magnitude of a source voltage of a first polarity to increase the magnitude of a control gate voltage of a second polarity.

24 Claims, 8 Drawing Sheets

U.S. PATENT DOCUMENTS

| | | |
|---|---|---|
| 5,949,717 A | 9/1999 | Ho et al. |
| 5,991,195 A | 11/1999 | Nobukata |
| 6,049,484 A | 4/2000 | Lee et al. |
| 6,049,486 A | 4/2000 | Lee et al. |
| 6,055,183 A | 4/2000 | Ho et al. |
| 6,122,201 A | 9/2000 | Lee et al. |
| 6,236,608 B1 | 5/2001 | Ratnam |
| 6,243,299 B1 | 6/2001 | Rhinerson et al. |
| 6,285,588 B1 | 9/2001 | Fastow |
| 6,614,693 B1 | 9/2003 | Lee et al. |
| 6,795,348 B2 * | 9/2004 | Mihnea et al. ......... 365/185.29 |
| 6,894,931 B2 | 5/2005 | Yaegashi et al. |
| 6,903,407 B1 | 6/2005 | Kang |
| 7,099,220 B2 * | 8/2006 | Mihnea et al. ............... 365/218 |
| 2003/0223272 A1 * | 12/2003 | Mihnea et al. ......... 365/185.29 |
| 2003/0235080 A1 | 12/2003 | Yaegashi et al. |
| 2004/0196685 A1 | 10/2004 | Miida |
| 2004/0233751 A1 * | 11/2004 | Mihnea et al. ............... 365/202 |
| 2004/0233762 A1 * | 11/2004 | Mihnea et al. ............... 365/222 |
| 2006/0007747 A1 * | 1/2006 | Mihnea et al. ......... 365/185.25 |

* cited by examiner

METHODS FOR NEUTRALIZING HOLES IN TUNNEL OXIDES IN TUNNEL OXIDES OF FLOATING-GATE MEMORY CELLS AND DEVICES

RELATED APPLICATIONS

This application is a divisional of U.S. patent application Ser. No. 10/875,452, filed Jun. 24, 2004 and titled "Methods for Neutralizing Holes in Tunnel Oxides of Floating-Gate Memory Cells and Devices," now U.S. Pat. No. 7,215,572 which is a divisional of U.S. patent application Ser. No. 10/159,885 filed May 29, 2002, now U.S. Pat. No. 6,795,348 issued Sep. 21, 2004 and titled "Method and Apparatus for Erasing Flash Memory," both of which are commonly assigned and incorporated by reference in their entirety herein.

TECHNICAL FIELD

The present invention relates in general to a method and apparatus for erasing of a non-volatile memory device and in particular to a method and apparatus for an erase operation of a memory array of a nonvolatile memory device that can reduce the number of trapped holes in the tunnel oxide of flash memory cells.

BACKGROUND

FIG. 1 illustrates a cross sectional view of a conventional flash memory cell 100. Memory cell 100 includes a substrate 102, a source 104, a control gate 108, a floating gate 106 electrically isolated by an insulating layer of silicon dioxide ($SiO_2$) 110, and a drain 112. Memory cell 100 is thus basically an n-channel transistor with the addition of a floating gate. Electrical access to floating gate 106 takes place only through a capacitor network of surrounding $SiO_2$ layers and source 104, drain 112, channel 105, and control gate 108. Any charge present on the floating gate 106 is retained due to the inherent Si—$SiO_2$ energy barrier height, leading to the non-volatile nature of the memory cell.

Programming a flash memory cell means that charge (i.e., electrons) is added to the floating gate 106. A high drain to source bias voltage is applied, along with a high control gate voltage. The gate voltage inverts the channel, while the drain bias accelerates electrons towards the drain. In the process of crossing the channel, some electrons will experience a collision with the silicon lattice and become redirected towards the Si—$SiO_2$ interface. With the aid of the field produced by the gate voltage some of these electrons will travel across the oxide and become added to the floating gate. After programming is completed the electrons added to the floating gate increase the cell's threshold voltage. Programming is a selective operation, performed on each individual cell.

Reading a flash memory cell takes place as follows. For cells that have been programmed, the turn-on voltage $V_t$ of cells is increased by the increased charge on the floating gate. By applying a control gate voltage and monitoring the drain current, differences between cells with charge and cells without charge on their floating gates can be determined. A sense amplifier compares cell drain current with that of a reference cell (typically a flash cell which is programmed to the reference level during manufacturing test). An erased cell has more cell current than the reference cell and therefore is a logical "1," while a programmed cell draws less current than the reference cell and is a logical "0."

Erasing a flash cell means that electrons (charge) are removed from the floating gate 106. Erasing flash memory is performed by applying electrical voltages to many cells at once so that the cells are erased in a "flash." A typical erase operation in a flash memory may be performed by applying a positive voltage to the source 104, a negative or a ground voltage to the control gate 108, and holding substrate 102 of the memory cells at ground. The drain 112 is allowed to float. Under these conditions, a high electric field (8-10 MV/cm) is present between the floating gate and the source. The source junction experiences a gated-diode condition during erase and electrons that manage to tunnel through the first few angstroms of the $SiO_2$ are then swept into the source. After the erase has been completed, electrons have been removed from the floating gate, reducing the cell threshold voltage Vt. While programming is selective to each individual cell, erase is not, with many cells being erased simultaneously.

Stress Induced leakage current (SILC) in a flash memory occurs when there is tunneling from the floating gate through the insulating oxide surrounding it at abnormally low voltages. This can result from holes that become trapped in the tunnel oxide of the flash memory cells after the memory cell has been cycled through read, write and erase operations a number of times, i.e., "stressed," and can severely degrade the performance of the memory. SILC presents a major challenge to designers and manufacturers of flash memory devices and will present even greater challenges as device size continues to be reduced and the insulating oxide surrounding the floating gate is made thinner.

Various solutions have been proposed to address the problem of SILC. For example, a triple well channel erase flash memory has been proposed in which a memory cell is fabricated inside a P-well that is, in turn, inside an N-well. Unfortunately, a triple well construction increases process complexity and memory area. Thus there is a need for a flash memory cell method and apparatus that reduces SILC as the device is cycled.

For the reasons stated above and for additional reasons stated hereinafter, which will become apparent to those skilled in the art upon reading and understanding the present specification, there is a need in the art for an improved method and apparatus for erasing flash memory. The above-mentioned problems of traditional flash memories and other problems are addressed by the present invention, at least in part, and will be understood by reading and studying the following specification.

Although, various embodiments have been illustrated using particular electronic components it will be understood by those of ordinary skill in the art that other circuit elements could be used to implement the invention and that the present invention is not limited to the arrangement of circuit elements disclosed. Moreover, it will also be understood in the art that the present invention could be applied to a erasing memory in devices other than flash memory circuits. Therefore, the present invention is not limited to a method and apparatus for erasing flash memory.

DETAILED DESCRIPTION

Figure 1:
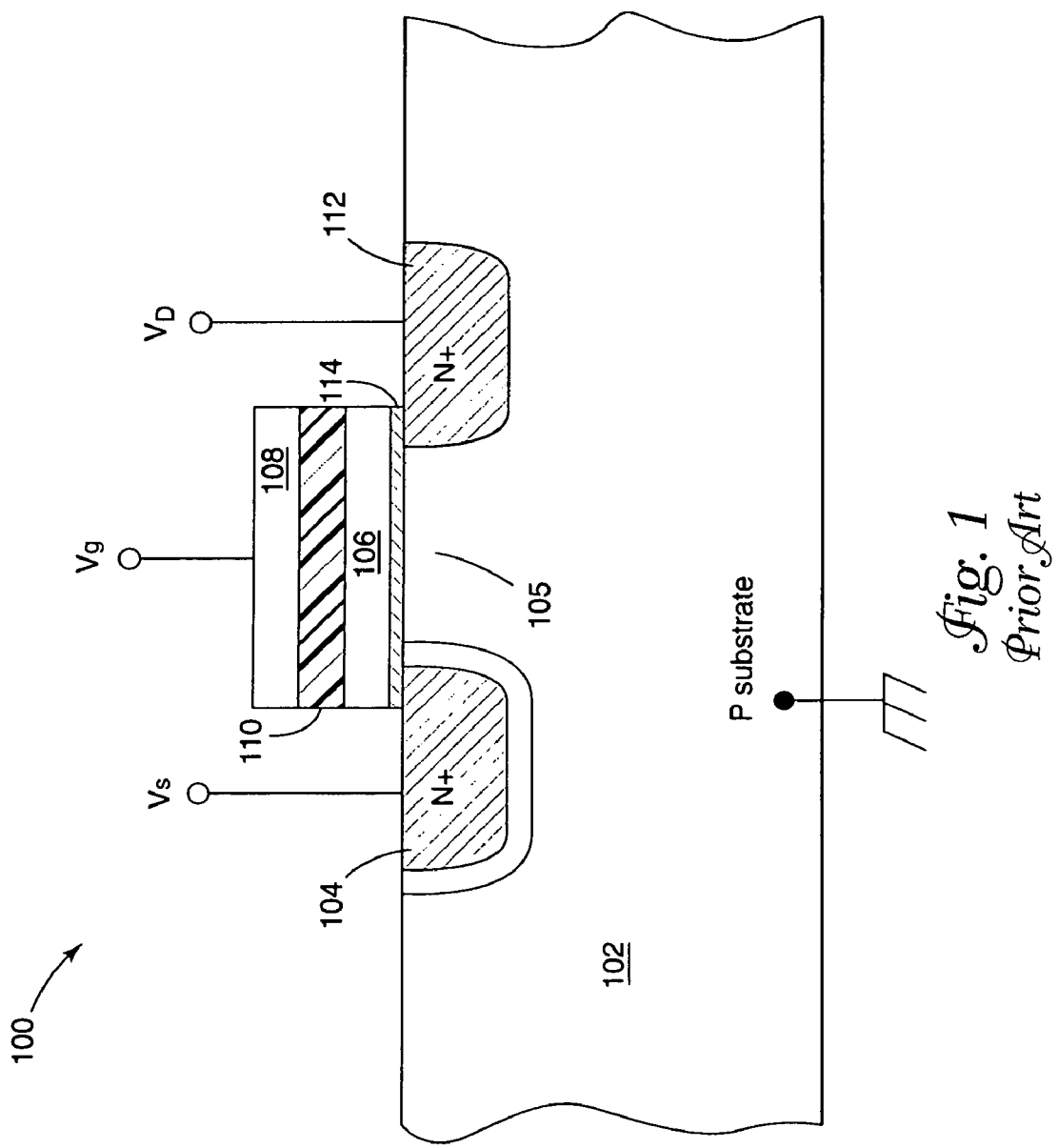
FIG. 1 is a block diagram of a prior art flash memory cell.

FIG. 1 shows a conventional floating gate memory cell 100 including an n+ type source 104, a p type channel 105, an n+ type drain 112, and a p type substrate 102. A floating gate 106 is sandwiched between an insulating dielectric layer 110 and thin tunnel oxide 114 over channel 105. Floating gate 106 is the memory storage element in a flash memory and is electrically insulated from other elements of the memory cell. Control gate 108 is located on top of the insulating dielectric 110 and is positioned over floating gate 106.

Figure 2:
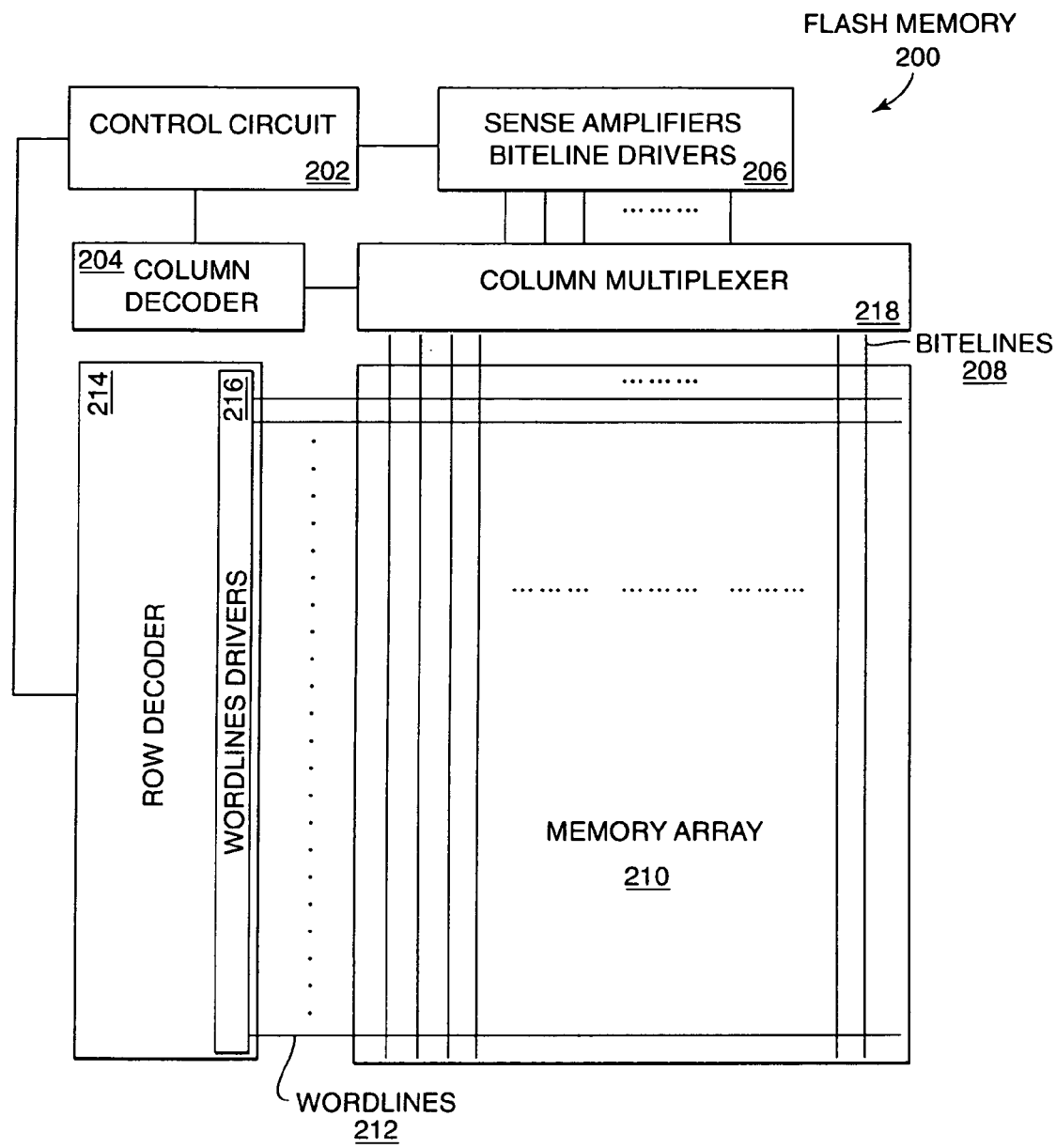
FIG. 2 shows a simplified schematic of a flash memory of an embodiment of the present invention.

FIG. 2 shows a simplified schematic of a flash memory 200 of the present invention. Flash memory 200 includes a control circuit 202 for controlling the operations of the memory such as reading, writing and erasing, column decoder 204, sense amplifiers/bitline drivers 206, column multiplexer 218, wordlines 212, memory array 210, bitlines 208, and row decoder 214 with wordline drivers 216.

Figure 3:
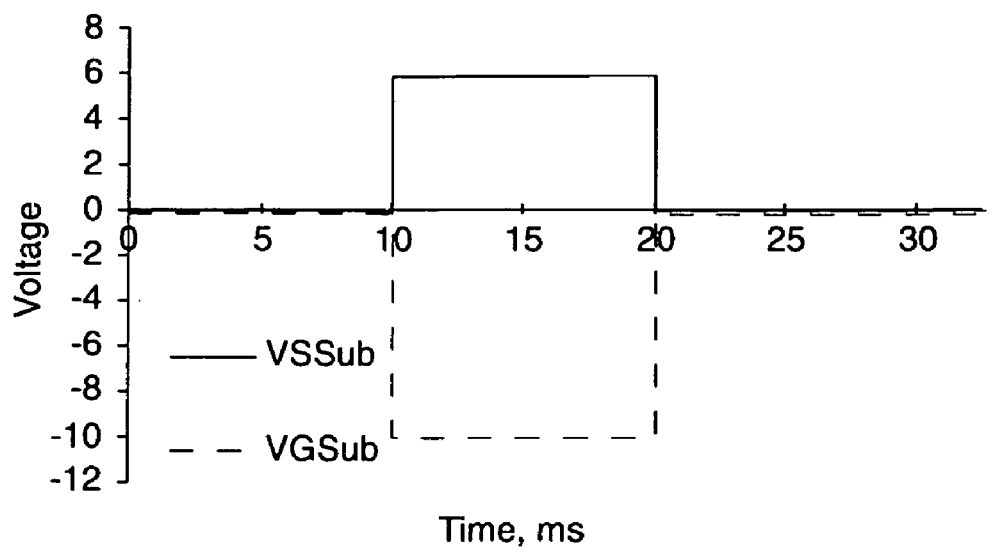
FIG. 3 is a graph showing an example of a sequence of pulses for a conventional source erase operation of a flash memory.

An example of the sequence of voltage pulses for a conventional flash memory erase operation is illustrated in FIG. 3. As can be seen, the source-drain voltage is increased to about 5 to 6 V while at the same time the gate-substrate voltage is decreased to about −10 V. This potential difference is held for about 10 ms and then abruptly discharged to zero. The combination of voltage values induces an electric field across tunnel oxide 114 between floating gate 106 and source 104, resulting in tunneling that drives electrons off floating gate 106 and effectively erases the memory cell. At the same time, however, the reverse bias on the junction between body 102 and source 104 injects holes into tunnel oxide 114 and some of these holes become trapped in tunnel oxide 114. Some of the trapped holes remain unneutralized at the end of an erase operation and/or after subsequent programming. The holes trapped in tunnel oxide 114 may effectively reduce the barrier for low-field electron injection from floating gate 106 into tunnel oxide 114, thus causing SILC and SILC-related charge loss or gain for the flash cell.

Figure 4:
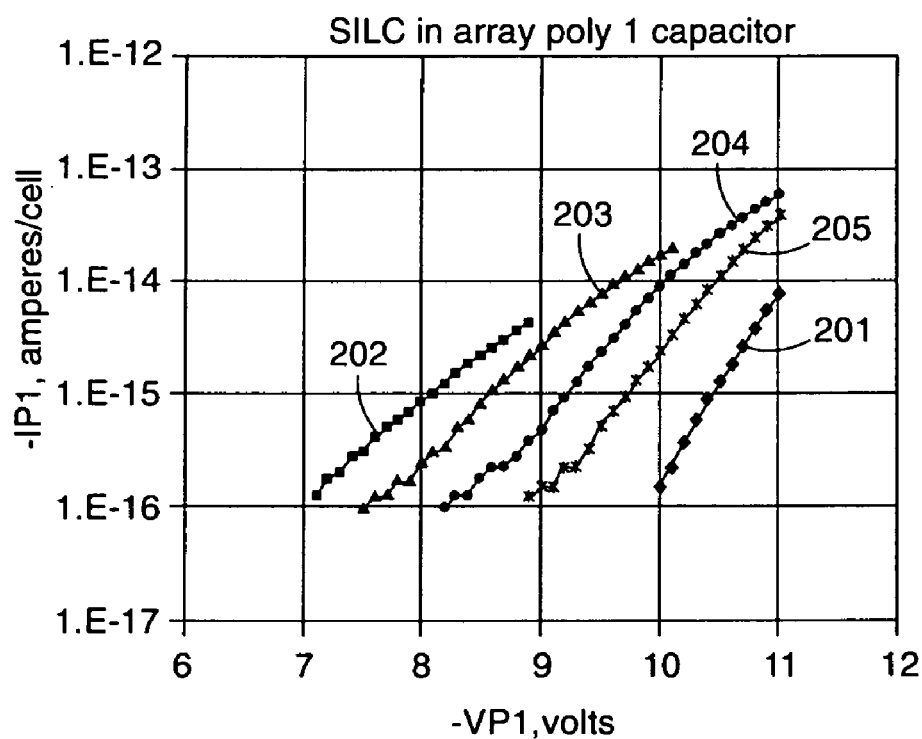
FIG. 4 is a graph showing the stress induced leakage current (SILC) from simulated application of successive erase-program cycles on an array of a flash memory cells.

An example of SILC in an array of 4096 flash memory cells having polysilicon 1 gates, connected in parallel is shown in FIG. 4. Curve 201 shows the tunnel I-V characteristics (IP1 vs. VP1) for a fresh, unstressed array in a voltage sweep (V-sweep) of the polysilicon 1 gate of the flash memory cells of the array at negative voltage with the substrate and source at ground. As curve 201 demonstrates, leakage current does not begin in a fresh, unstressed array until there is a gate-substrate potential of −10V. Curve 202 shows the result of stressing, i.e., application of successive erase-program cycles on an array of floating gate cells. In this example, stressing is simulated by a constant voltage stress in which the gate-substrate is held at −10V and the source-substrate is held at 6 V, a high reverse junction bias, for 200 seconds. Curve 202 shows that onset of leakage current will occur at an abnormally low voltage of about −7V, after stressing the array. Curves 203, 204 and 205 show successive V-sweeps where the stress voltage has been removed, the gate voltage successively swept to further negative values, and the substrate and source are held at ground. Curves 203, 204 and 205 demonstrate that the SILC is suppressed and the onset of tunneling is advantageously shifted to a higher negative gate-substrate voltage after the array has been subjected to gate V-sweeps at zero voltage across the source-substrate junction. In each successive V-sweep curve, the onset of tunneling is pushed back to a higher voltage, and thus, SILC is more effectively suppressed.

Based on the results above, a qualitative model can be designed for the creation and suppression of SILC. SILC is created and/or enhanced when the gated source diode is subjected to high reverse bias and there is low tunneling current across the gate oxide. These conditions are favorable for hole generation and injection into the gate oxide. On the other hand, SILC may be suppressed when the gated source diode is subjected to a high electron tunneling current across the gate oxide at zero or low reverse current bias for the source junction.

Figure 5:
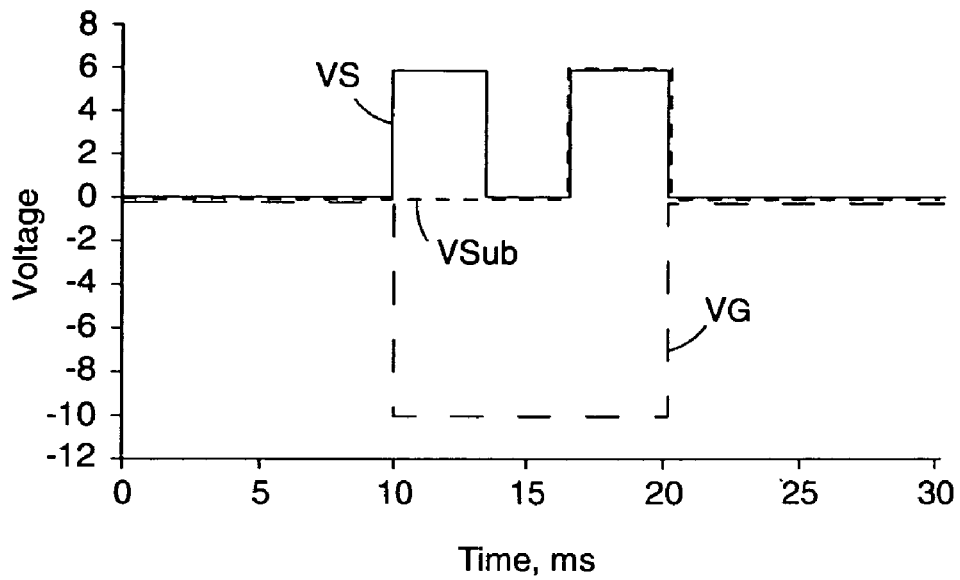
FIG. 5 is a graph showing a prior art example of a sequence of pulses for an erase operation of a flash memory built inside a triple well showing an extra step of a channel erase.

Various approaches may be suggested based on the above model. One possible way to neutralize holes trapped in the tunnel oxide during an erase pulse is to apply a condition of uniform tunneling at high negative gate and low or zero positive source voltage at the end of the erase pulse. This Prior Art approach is illustrated in FIG. 5. As can be seen, two positive 6 V pulses of about 3 ms are applied to the source (Vs) over a 10 ms erase period. A positive 6 V pulse is also applied to the substrate (Vsub) concurrent with the second positive source pulse. The gate-substrate voltage (VG) is held at negative 10V for the entire 10 ms period. Application of a positive voltage pulse on the substrate allows the erase operation to be done in a single step channel erase. However, this also requires the added complexity of building the memory array inside a triple well.

Figure 6:
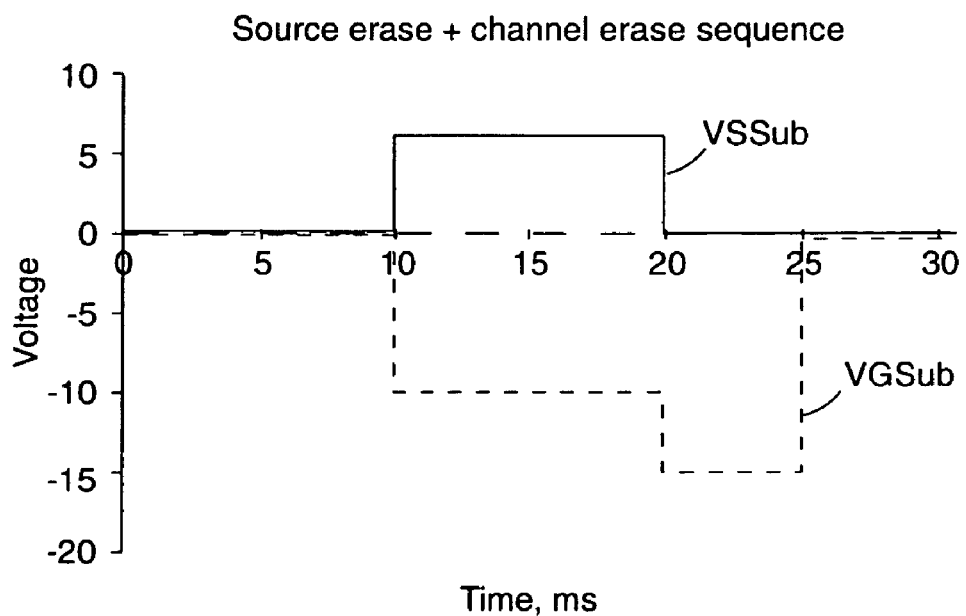
FIG. 6 is a graph showing an example of a sequence of pulses for an erase operation of a flash memory to neutralize trapped holes, according to the present invention.

A channel erase condition may also be realized by applying an additional voltage pulse of higher negative value to the gate (wordlines) while the source is biased at the same potential as the substrate (ground), after the regular erase pulse. This procedure is illustrated in FIG. 6. As can be seen, a positive pulse of about 5V is applied between source and substrate for a period of about 10 ms. At the same time, the gate substrate voltage is taken to negative 10V. At the end of the 10 ms period when the source-substrate voltage is reduced to zero, the voltage between the gate and substrate is increased to negative 15 volts and held at that potential for an additional 5 ms. While this approach can be implemented on a flash memory without a triple well surrounding the array, it has the disadvantage of requiring extra erase time and the supply of a higher negative voltage.

Figure 7A:
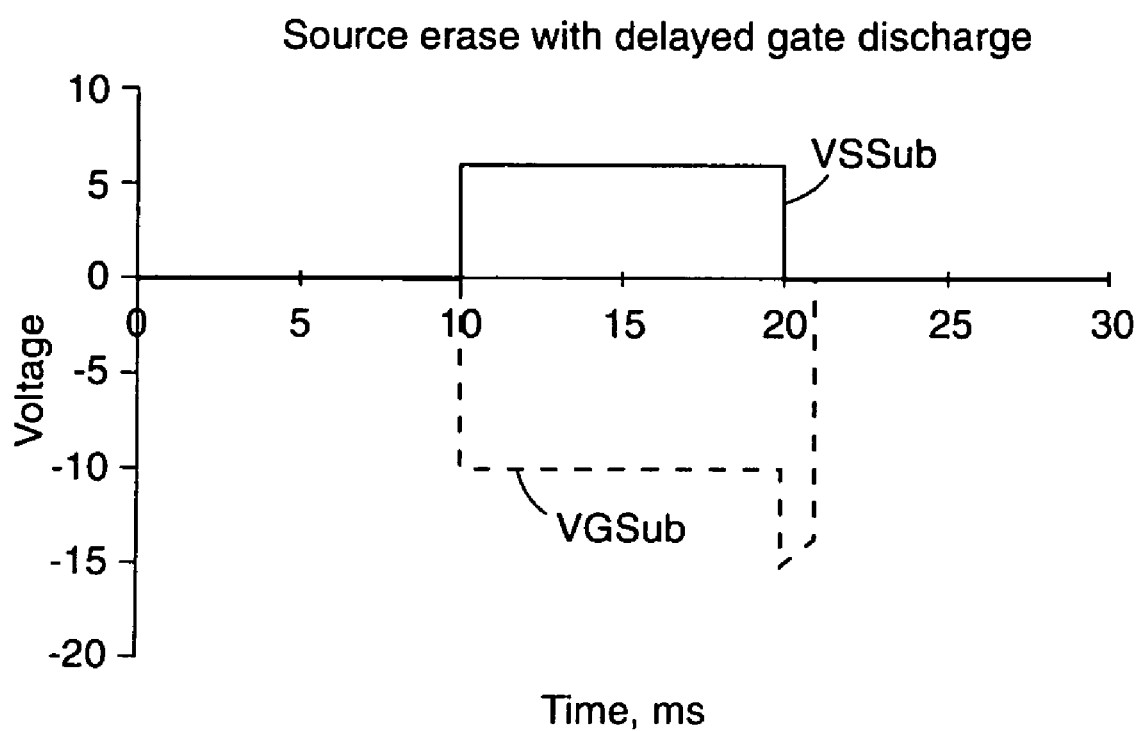
FIG. 7A is a graph showing an example of a sequence of pulses for an erase operation of a flash memory to neutralize trapped holes that does not require a higher negative voltage source, according to the present invention.

A more convenient approach, illustrated in FIG. 7A, is to discharge the source toward the substrate potential (or other area of common voltage) at the end of the regular erase pulse, while the negative voltage to the control gate (wordlines) is maintained. As can be seen, a positive pulse of about 5V is applied between source and substrate for about 10 ms. At the same time, the gate-substrate voltage is brought to negative 10 V and held for the 10 ms period. At the end of the 10 ms period, the source-substrate potential is discharged rapidly, in a fraction of a millisecond, but the discharge of negative gate-substrate voltage is delayed for a time in the range of 1-100 ms. During this interval the negative voltage is allowed to float and any regulation of the voltage supplied by the negative pump is disabled. The excess negative wordline voltage thus created will be called "negative gate bootstrap" in the following paragraphs. In this case, the rapidly falling source-substrate voltage will couple to the floating gates and onto the control gates (wordlines), in effect, pushing them more negative below the voltage supplied by the negative pump. Thus, the desired condition of relatively high negative voltage for the wordlines and floating gates along with zero voltage source to substrate bias will be realized on a transient basis without the need for generating a higher negative voltage, or for adding extra time to the erase operation.

FIG. 7A depicts the expected behavior for the gate voltage VGSub if the forced discharge of the source VSSub takes place in a time of a fraction of 1 millisecond or faster. The amount of the excess negative gate voltage and its gradual decrease on the waveform for VGSub after the discharge of the source (VSSub) and before the active discharge of the gate represent the capacitive coupling of the VSSub transient and the subsequent natural decay for the voltage on the control gate (wordline) when left floating. The rate of decay depends on the aggregate leakage of the gates, which in turn is determined by the structure and layout of the transistors in the periphery of the memory array which drive the cell control gates, or wordlines. Note that any leakage of the control gates through tunnel oxide as represented in FIG. 4, would not affect the rate of VGSub decay in FIG. 7A since it would not contribute leakage to the control gate.

To the extent that the relevant wordline drivers in the periphery are devised to have low parasitic capacitance compared to the capacitance between the source and the control gate (wordline) of the memory cells on each row, and low leakage, the excess negative voltage VGSub can be larger and hold for a longer time without substantial decay. In the limit of negligible parasitic capacitance and fast discharging of VSSub, the maximum amplitude of excess negative gate voltage would be equal in absolute value to the amplitude of the source voltage. On the other hand, if the leakage of the wordline drivers were ideally zero, the excess negative voltage on the gate would be assumed to hold indefinitely with no decay as long as it is not forcefully discharged to ground potential by external circuitry.

Thus, if the design of the memory circuit fulfills the three conditions described above, i.e.,
1. fast—shorter than 1 ms—discharging for VSSub,
2. low parasitic capacitance for wordline drivers—in the order of 1-10 fF or below, and
3. low drain leakage for the same wordline drivers—in the order of pA, then each erase pulse represented by the waveforms in FIG. 7A can be regarded as a succession of two erase mechanisms: source erase and channel erase, and the relative duration for each mechanism can be adjusted by the designer to fit the specification for a particular memory design.

If a particular memory application requires fast erase and not very stringent retention limits for each particular cell, then such a memory can be designed with a short channel erase time compared to the source erase time. Source erase is inherently more efficient than channel erase at equal applied voltage due to a better coupling factor for the applied voltage. Thus such a design will result in a shorter total erase time, but also in poorer memory retention since the holes generated by the source erase mechanism will have a shorter time to neutralize in the subsequent channel erase part of the erase pulse. Such a design may benefit large density data storage memory in which fast erase/program rates are sought, and data correction provisions like storage of additional parity codes, can be used to correct an inherently weak retention.

At the other end of the spectrum, if a particular memory requires very good retention but does not pose a stringent limit on the erase time, the time for source erase within an erase pulse can be reduced to as little as 1 ms or less, followed by a long time for channel erase of up to 100 ms or more. In this way, most of the electrons stored on the floating gate of each cell will tunnel out during the channel erase part of the erase pulses, and the hole trapping phenomenon associated with source erase will effectively be avoided at the expense of a longer erase time. This approach may be useful in code storage applications where erasure and reprogramming operations occur rarely and do not require fast time rates, but the preservation of stored data over long periods of time is critical.

Negative gate erase can be implemented in flash memory by using a row decoder that includes either all P channel wordline driver transistors, or CMOS drivers with N channel pull-down transistors in triple well. In the following, a possible implementation of "negative gate bootstrap" for the memory with P channel wordline drivers will be described. The same idea with small changes may be applied to the memory with triple-well N channel wordline drivers.

Figure 8:
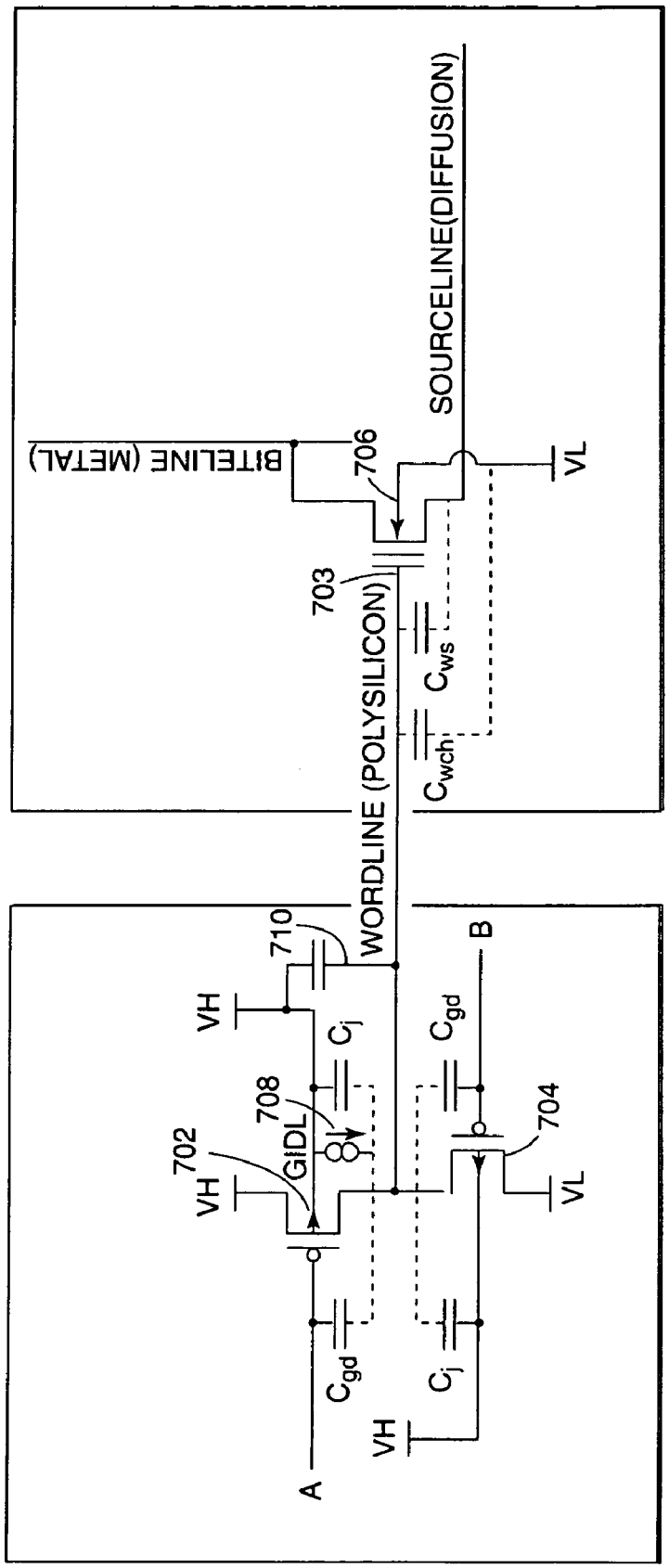
FIG. 8 is a simplified schematic of a flash memory with P channel wordline drivers.

FIG. 8 depicts a design with all P channel driver circuits in the row decoder for a memory device such as memory 200 of FIG. 2, including pull-up transistor 702 and pull-down transistor 704. The circuit drives a wordline 703 coupled to memory cells 706 of the memory device. The voltages VH and VL represent respectively the "high" and "low" voltage supply rails. Their absolute values are specific to each memory function like read, program and erase, and their relative difference VH−VL is always positive. The values for the pull-up and pull-down signals, labeled respectively A and B, are specific to the memory function and to the selected or unselected condition of the particular row.

In particular, all rows of a memory block are selected in the erase function, and thus the signals A and B will assume the same values for all wordlines in the block to be erased. A possible set of such values is:

VH=3.3 V; VL=−10 V; A=3.3 V; B=−10 V

This would result in a wordline voltage of −8.5 V to −9 V depending on the threshold voltage of the P channel transistors.

In order to implement the above idea of a "negative bootstrap" for the wordlines in erase mode, the variables VH, VL, A, B in the schematic of FIG. 8 may be set to follow the dynamics in FIG. 7B or FIG. 7C below.

Capacitive components $C_{ws}$ and $C_{wch}$ in the flash memory array of FIG. 8 represent the capacitance between a wordline and the source of all the memory cells, and respectively, the capacitance between a wordline and the channel of all the memory cells. During an erase, the channel is in accumulation state and thus electrically connected to the common substrate for all the memory cells in a block.

Figure 7B:
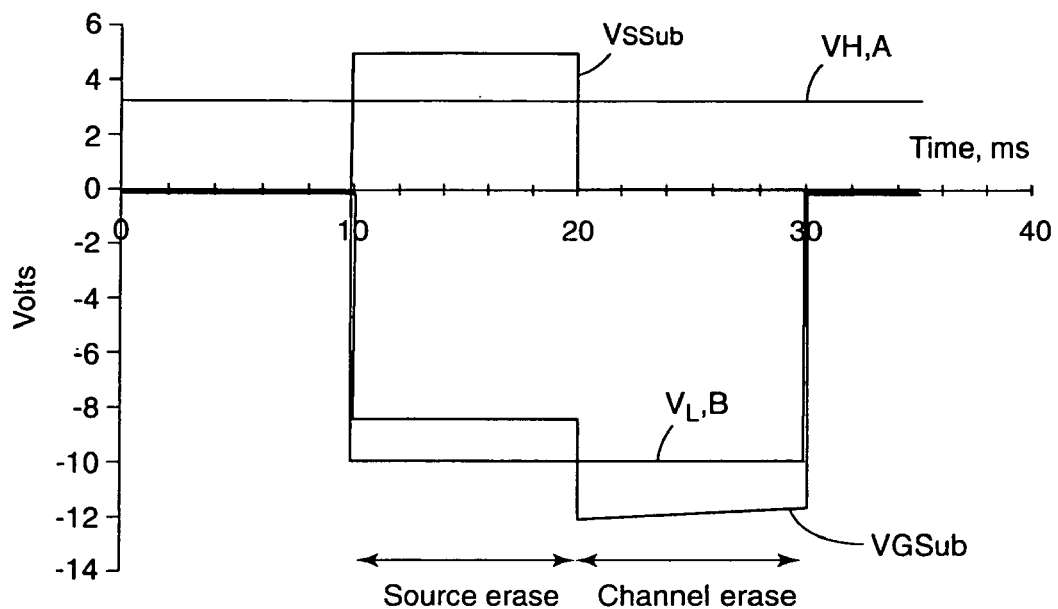
FIG. 7B is a graph showing an additional example of a sequence of pulses for an erase operation of a flash memory, according to the present invention.
Figure 7C:
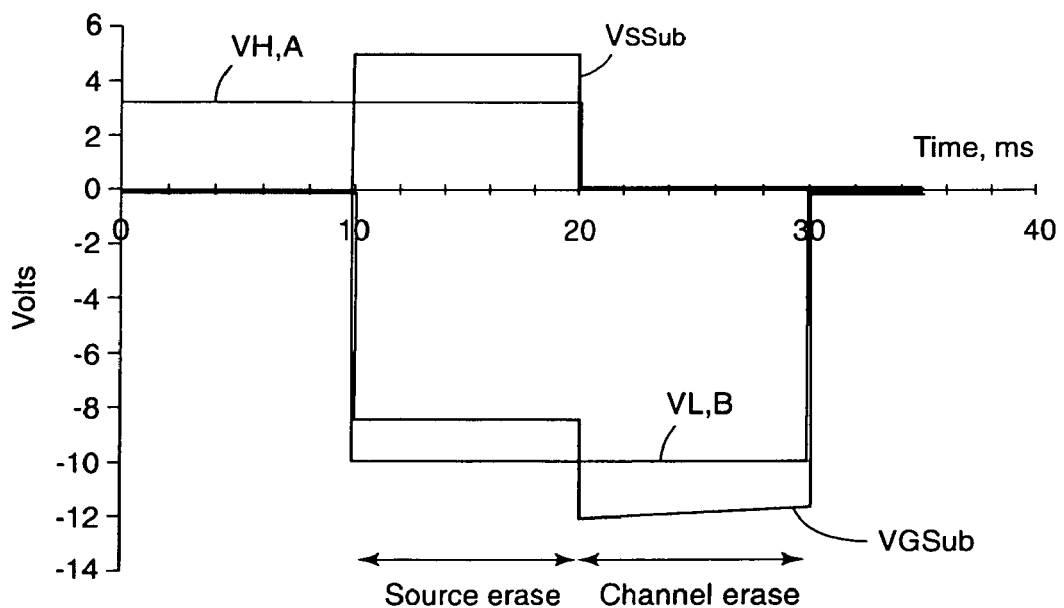
FIG. 7C is a graph showing an additional example of a sequence of pulses for an erase operation of a flash memory

The falling edge of the source pulse VSSub in FIGS. 7A, 7B and 7C induces the negative bootstrap (negative overvoltage) on VGSub by capacitive coupling through $C_{ws}$. If we ignore the parasitic capacitances of the driver transistors, the magnitude of the negative voltage overshoot can be calculated as:

$$|delta(VGSub)|=VSSub*C_{ws}/(C_{ws}+C_{wch}).$$

Thus, the negative bootstrap will improve as $C_{ws}$ is increased and/or $C_{wch}$ is decreased.

If erase is implemented as in FIG. 7B, the parasitic capacitance components $C_{gd}$ and $C_j$ for all the P channel transistors in the row decoder in FIG. 8 need to be reduced in order to enhance the capacitive coupling of the wordline in the "negative bootstrap" effect. The gate-to-drain parasitic capacitance $C_{gd}$ has a component of overlap of drain diffusion by the gate and another related to the fringing field between drain surface and gate stack sidewall. Both of these components can be reduced with the help of an oxide spacer located between the gate sidewall and the adjoining drain diffusion. A low drain-to-body junction capacitance $C_j$ can be obtained by using low doping concentration for the drain diffusion and/or low doping concentration in the channel (N well).

On the other hand, the dynamics of FIG. 7C can be implemented for erase. Voltages VH and A are reduced in FIG. 7C at the end of the VSSub pulse. In this case all the parasitic capacitances in FIG. 8 with the exception of $C_{gd}$ for pull-down transistor 704 (capacitive coupling between wordline and the signal B) are in fact aiding the coupling for "negative bootstrap" and need not be minimized. The coupling for negative bootstrap can be further increased in such a case by providing an extra capacitor 710 between the VH supply and the wordline in the circuit as shown in FIG. 8.

The retention of excess negative voltage VGSub during the channel erase part of the erase pulse is adversely impacted by the drain-to-body leakage of the P channel transistors driving the wordline. This leakage is represented in FIG. 8 by a variable current generator 708 between the source/drain diffusion and the body of the transistor (N well). In practice, an important component of such leakage is known as gate-induced drain leakage (GIDL) and is strongly increasing with the voltage drop between gate and drain. Thus, GIDL appears of concern only for the pull-up P channel transistor 702 in FIG. 8 in which the gate-to-drain voltage drop is large in erase. Such voltage drop is smaller for the erase dynamics according to FIG. 7C, this scheme appears to offer advantages in both coupling and retention for the excess negative gate voltage.

Figure 9:
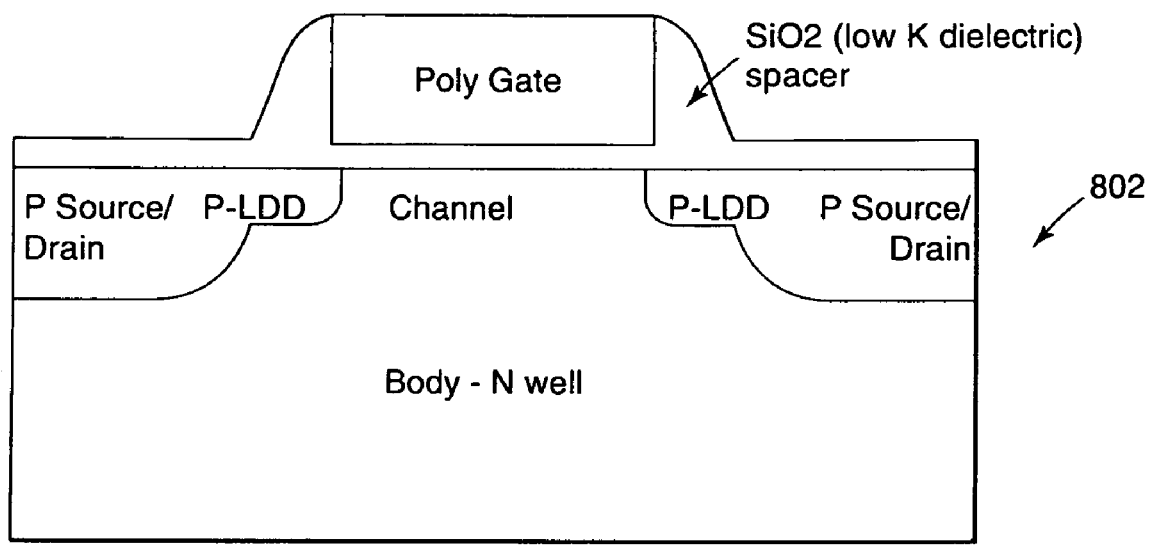
FIG. 9 is a side cut view of a P channel transistor showing components relevant to parasitic capacitances.

In terms of transistor structure, the features listed above for reducing the parasitic gate-to-drain capacitance like a gate spacer and/or low doping concentration for the drain diffusion are also conducive to reduced GIDL. FIG. 9 depicts an exemplary P channel MOSFET structure 802 with all the components relevant to the parasitic capacitances $C_{gd}$, $C_j$ shown. In order to minimize parasitic capacitance and decrease GIDL the wordline drive transistors should be fabricated so that lightly doped drain (LDD) regions are present as shown in FIG. 9 so as to minimize parasitic capacitance. In addition a low k dielectric SiO2 gate spacer may be added to reduce parasitic capacitance. Other techniques may likewise be applied to reduce parasitic capacitance as would be familiar to those of ordinary skill in the art.

Thus, as can be seen from the foregoing, memory devices can be designed to comply with a fixed specified erase time and retention performance. On the other hand, a new kind of memory can be designed in which the respective durations of source erase and channel erase can be made adjustable by way of algorithm codes stored in a special function register or other nonvolatile memory dedicated to such control parameters. In this way, the manufacturer can build a generic memory part and then adjust the duration for either erase mechanism at the time of manufacturing test, or else let the user make such adjustment before or after the device has been assembled in the system for the end use.

CONCLUSION

A method and apparatus for erasing flash memory has been described. The method includes supplying a negative voltage pulse to the control gate of a memory cell for an erase period, supplying a positive voltage pulse to the source of the memory cell for a period that is shorter in duration than the erase period; and discharging the positive voltage pulse at the end of the second period wherein discharging the positive voltage pulse at the end of the second period effectively increases the magnitude of the negative voltage pulse.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of neutralizing holes in the tunnel oxide of a floating-gate memory cell, the method comprising:
    after applying a positive voltage to a source of the memory cell relative a common voltage while applying a first negative voltage to a control gate of the memory cell relative the common voltage, discharging the positive voltage and disabling any voltage regulation of the first negative voltage; and
    allowing the first negative voltage to discharge for a predetermined period.

2. The method of claim 1, further comprising discharging the positive voltage at a rate sufficient to couple a second negative voltage to a floating gate of the memory cell during the predetermined period.

3. The method of claim 2, wherein discharging the positive voltage occurs in less than 1 ms.

4. The method of claim 2, wherein the second negative voltage has a magnitude of at least about 3 volts.

5. The method of claim 1, wherein holes are neutralized during the predetermined period.

6. The method of claim 1, wherein the predetermined period is at least about 2 ms.

7. The method of claim 6, wherein the predetermined period is at least about 10 ms.

8. The method of claim 1, further comprising programming a duration of the predetermined period after manufacture of a memory device containing the memory cell.

9. The method of claim 1, wherein a magnitude of the second negative voltage is effectively increased by using wordline drive transistors with low parasitic drain capacitance compared with a wordline capacitance.

10. The method of claim 9, wherein the low parasitic drain capacitance is on the order of 1-10 fF.

11. The method of claim 1, wherein disabling any voltage regulation of the first negative voltage further comprises disabling any regulation of the first negative voltage by a negative pump used to supply the first negative voltage.

12. The method of claim 1, wherein the positive voltage is between approximately 4V to 6V.

13. The method of claim 1, wherein the first negative voltage is initially between approximately −8V to −13V.

14. A method of neutralizing holes in the tunnel oxide of a floating-gate memory cell, the method comprising:
- after applying a positive voltage to a source of the memory cell relative a common voltage while applying a first negative voltage to a control gate of the memory cell relative the common voltage, discharging the positive voltage and disabling any voltage regulation of the first negative voltage; and
- allowing the first negative voltage to discharge for a predetermined period of at least about 2 ms;
- wherein discharging the positive voltage occurs at a rate sufficient to couple a second negative voltage to a floating gate of the memory cell during the predetermined period.

15. The method of claim 14, wherein discharging the positive voltage occurs in less than 1 ms.

16. The method of claim 14, wherein the second negative voltage has a magnitude of at least about 3 volts.

17. The method of claim 14, wherein holes are neutralized during the predetermined period.

18. The method of claim 14, wherein the predetermined period is at least about 10 ms.

19. The method of claim 14, further comprising programming a duration of the predetermined period after manufacture of a memory device containing the memory cell.

20. The method of claim 14, wherein a magnitude of the second negative voltage is effectively increased by using wordline drive transistors with low parasitic drain capacitance compared with a wordline capacitance.

21. The method of claim 20, wherein the low parasitic drain capacitance is on the order of 1-10 fF.

22. The method of claim 14, wherein disabling any voltage regulation of the first negative voltage further comprises disabling any regulation of the first negative voltage by a negative pump used to supply the first negative voltage.

23. The method of claim 14, wherein the positive voltage is between approximately 4V to 6V.

24. The method of claim 14, wherein the first negative voltage is initially between approximately −8V to −13V.

\* \* \* \* \*

UNITED STATES PATENT AND TRADEMARK OFFICE
CERTIFICATE OF CORRECTION

PATENT NO.         : 7,277,328 B2                                    Page 1 of 1
APPLICATION NO.    : 11/217828
DATED              : October 2, 2007
INVENTOR(S)        : Mihnea et al.

It is certified that error appears in the above-identified patent and that said Letters Patent is hereby corrected as shown below:

On the title page, item (54), under "Title", column 1, line 2, before "OF" delete "IN TUNNEL OXIDES".

In column 1, line 2, before "OF" delete "IN TUNNEL OXIDES".

Signed and Sealed this

Eleventh Day of December, 2007

JON W. DUDAS
*Director of the United States Patent and Trademark Office*